(12) United States Patent
Guo

(10) Patent No.: US 7,932,818 B1
(45) Date of Patent: Apr. 26, 2011

(54) SYSTEM FOR COMMUNICATING DIAGNOSTIC INFORMATION AND RELATED METHOD

(75) Inventor: Sam Y Guo, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 267 days.

(21) Appl. No.: 12/145,171

(22) Filed: Jun. 24, 2008

(51) Int. Cl.
*B60Q 1/00* (2006.01)

(52) U.S. Cl. ......... 340/438; 340/439; 340/441; 340/521

(58) Field of Classification Search .................. 340/438, 340/439, 441, 518, 519, 521, 529, 531; 701/29, 701/35; 73/1.37, 1.38, 659, 660
See application file for complete search history.

(56) References Cited

U.S. PATENT DOCUMENTS

| | | | |
|---|---|---|---|
| 4,271,402 A * | 6/1981 | Kastura et al. | 340/459 |
| 5,651,070 A | 7/1997 | Blunt | |
| 7,013,210 B2 * | 3/2006 | McBrien et al. | 701/100 |
| 7,237,169 B2 * | 6/2007 | Smith | 714/742 |
| 7,295,882 B2 | 11/2007 | Champion et al. | |
| 2002/0078742 A1 | 6/2002 | Kim | |
| 2007/0124039 A1 | 5/2007 | Sakurai et al. | |

* cited by examiner

*Primary Examiner* — Hung T. Nguyen
(74) *Attorney, Agent, or Firm* — Harness, Dickey & Pierce, P.L.C.

(57) ABSTRACT

A method for transmitting diagnostic information that can include: selecting a frequency from a plurality of predetermined frequencies based on a first diagnostic condition; selecting a duty cycle from a plurality of predetermined duty cycles based on a second diagnostic condition; and generating a diagnostic signal that is transmitted over a single wire, the diagnostic signal being based on the selected frequency and the selected duty cycle. A system for communicating diagnostic information is also provided.

21 Claims, 2 Drawing Sheets

US 7,932,818 B1

SYSTEM FOR COMMUNICATING DIAGNOSTIC INFORMATION AND RELATED METHOD

INTRODUCTION

The present invention generally relates to systems for communicating diagnostic information and more particularly to a system and related method for transmitting diagnostic information in a relatively inexpensive manner.

Modern automotive vehicles include a plurality of controllers to control and monitor various aspects of a vehicle. A first controller may be employed to identify when certain vehicle aspects should be changed, while a second controller may be employed for control of that vehicle aspect. In such instances, it may be necessary to communicate diagnostic information relating to the vehicle aspect to the first controller as such diagnostic information may require further action on the part of the first controller. For example, the first controller may transmit a signal to the second controller indicating that a motor should be activated (e.g., to close a door or window). The second controller may need to communicate information to the first controller, such as a motor direction and a condition of the circuit that powers the motor (e.g., normal, overload, over voltage, short circuit).

Traditionally, two methods have been employed to transmit such information between controllers in an automotive vehicle. One method employs microcontrollers, communication drivers and protocols, such as LIN or CAN. Another method employs a plurality of discreet wires, with each wire being employed to transmit information on a single diagnostic characteristic. A more cost effective approach is desired for communicating diagnostic information.

SUMMARY

In one form, the present teachings provide a system for reporting diagnostic information. The system can include a frequency source, a frequency selector, a duty cycle converter and a duty cycle selector. The frequency source provides a plurality of frequency signals that are associated with different frequencies. The frequency selector selects one of the frequency signals according to a first diagnostic characteristic. The duty cycle converter generates a plurality of intermediate signals that have the frequency of the selected frequency signal but are associated with different duty cycles. The duty cycle selector selects one of the intermediate signals based on a second diagnostic characteristic and outputs a resulting output signal indicative of the first and second diagnostic characteristics In another form, the present teachings provide a system for reporting diagnostic information. The system can include a duty cycle converter, a duty cycle selector, a frequency source and a frequency selector. The duty cycle generator can generating at least two intermediate signals having different duty cycles. The duty cycle selector can select one of the intermediate signals according to a first diagnostic characteristic. The frequency source can receive the selected one of the intermediate signals and can generate a plurality of frequency signals. Each of the frequency signals can have a different frequency and a duty cycle associated with a duty cycle of the selected one of the intermediate signals. The frequency selector can select one of the plurality of frequency signals according to a second diagnostic characteristic and can output a resulting output signal indicative of the first and second diagnostic characteristics.

In yet another form, the present teachings provide a method for transmitting diagnostic information that can include: selecting a frequency from a plurality of predetermined frequencies based on a first diagnostic condition; selecting a duty cycle from a plurality of predetermined duty cycles based on a second diagnostic condition; and generating a diagnostic signal that is transmitted over a single wire, the diagnostic signal being based on the selected frequency and the selected duty cycle.

Further areas of applicability will become apparent from the description provided herein. It should be understood that the description and specific examples are intended for purposes of illustration only and are not intended to limit the scope of the present disclosure, its application and/or uses in any way.

BRIEF DESCRIPTION OF THE DRAWINGS

The drawings described herein are for illustration purposes only and are not intended to limit the scope of the present disclosure in any way. Similar or identical elements are given consistent identifying numerals throughout the various figures.

DETAILED DESCRIPTION OF THE VARIOUS EMBODIMENTS

Figure 1:
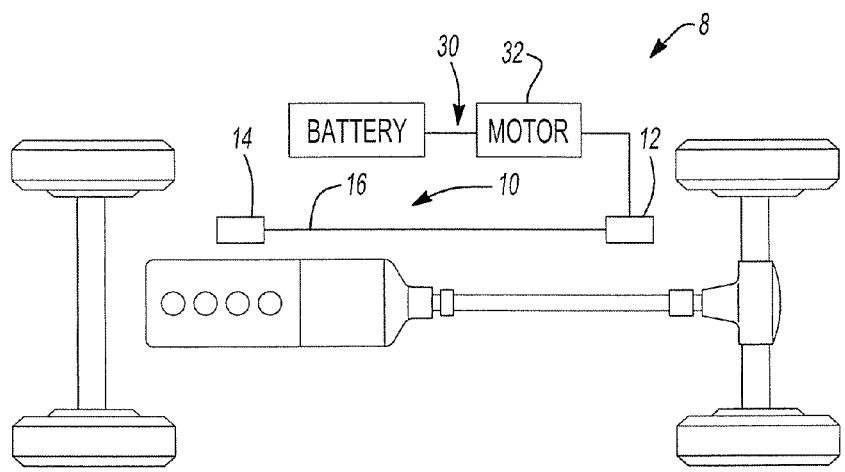
FIG. 1 is a schematic illustration of a vehicle with a diagnostic information system constructed in accordance with the teachings of the present disclosure.

With reference to FIG. 1 of the drawings, a vehicle 8 having a diagnostic information system 10 constructed in accordance with the teachings of the present invention is illustrated. The diagnostic information system (DIS) 10 can include a first controller 12, a second controller 14 and a single wire 16 that can be employed to transmit diagnostic information from the first controller 12 to the second controller 14. As used herein, the term "controller" refers to an application specific integrated circuit (ASIC), an electronic circuit, a processor (shared, dedicated or group) and memory that executes one or more software or firmware programs, a combinational logic circuit, or other suitable components that provide the described functionality.

Figure 2:
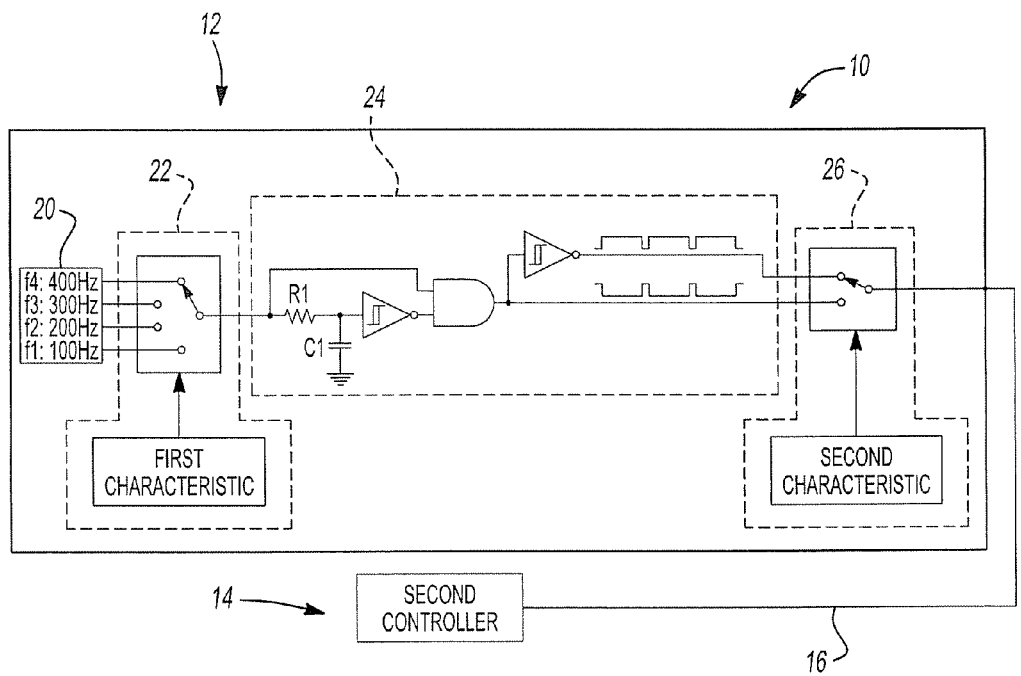
FIG. 2 is a schematic illustration of the diagnostic information system of FIG. 1.

With additional reference to FIG. 2, the first controller 12 can include a frequency source 20, a frequency selector 22, a duty cycle converter 24 and a duty cycle selector 26.

The frequency source 20 can be configured to generate a plurality of first intermediate signals having different, predetermined frequencies. Each of the frequencies can be associated with a first diagnostic characteristic, such as a condition of a motor circuit 30 (FIG. 1) that is employed to power a motor 32 (FIG. 1). In the particular example provided, the motor circuit 30 has four possible conditions (i.e., normal operation, overload operation, over voltage operation, and short-circuit operation) and as such, four discrete frequencies can be employed to uniquely identify each of these conditions. By way of example, a frequency of 100 Hz can correspond to operation of the motor circuit 30 in a normal condition, a frequency of 200 Hz can correspond to operation of the motor circuit 30 in an overload condition, a frequency of 300 Hz can correspond to operation of the motor circuit 30 in an over voltage condition and a frequency of 400 Hz can correspond to operation of the motor circuit 30 in a short circuit condition.

The frequency selector 22 can receive the first intermediate signals and can select and output a selected one of the first intermediate signals based on the first diagnostic characteristic. In the example provided, the frequency selector 22 is a MUX (multiplexer) that is responsive to the condition of the motor circuit 30. By way of example, the motor circuit 30 is operating in a short-circuit condition, and consequently, the frequency selector 22 has selected the first intermediate signal that is associated with a frequency of 400 Hz. The selected one of the first intermediate signals can be output to the duty cycle converter 24.

The duty cycle converter 24 can be configured to generate signals having different, predetermined duty cycles. Each of the duty cycles can be associated with a second diagnostic characteristic, such as a rotational direction of the motor 32. In the particular example provided, the motor 32 can be rotated in a clockwise rotational direction or a counter-clockwise rotational direction and as such, two discrete duty cycles can be employed to uniquely identify each of the rotational direction of the motor 32. By way of example, a duty cycle of 20% can be employed to designate rotation of the motor 32 in the clockwise rotational direction, while a duty cycle of 80% can be employed to designate rotation of the motor 32 in the counter-clockwise direction.

The duty cycle converter 24 can receive selected one of the first intermediate signals and can generate a plurality of second intermediate signals. Each of the second intermediate signals can have the frequency of the selected one of the intermediate signals (i.e., 400 Hz in the example provided), as well as a duty cycle that could be associated with the second diagnostic characteristic.

The duty cycle selector 26 can receive the second intermediate signals and can select and output one of the second intermediate signals based on the second diagnostic characteristic. In the example provided, the duty cycle selector 26 is a MUX that is responsive to the rotational direction of the motor 32. By way of example, the motor 32 is rotating in a counter-clockwise rotational direction and consequently, the duty cycle selector 26 has selected the second intermediate signal that is associated with a duty cycle of 80%. The selected one of the second intermediate signals can be output from the duty cycle selector 26. This resulting output signal is indicative of the first and second diagnostic characteristics. In this regard, the resulting output signal has a frequency that is associated with the first diagnostic characteristic (i.e., 400 Hz in the example provided to correspond to short-circuit operation of the motor circuit 30), as well as a duty cycle that is associated with the second diagnostic characteristic (i.e., 80% in the example provided to correspond to operation of the motor 32 in a counter-clockwise direction).

The resulting output signal can be transmitted over the single wire 16 to the second controller 14, which can be configured to interpret the resulting output signal in a desired manner. For example, the second controller 14 can be configured with various demultiplexers that permit the first and second diagnostic characteristics to be identified.

Figure 3:
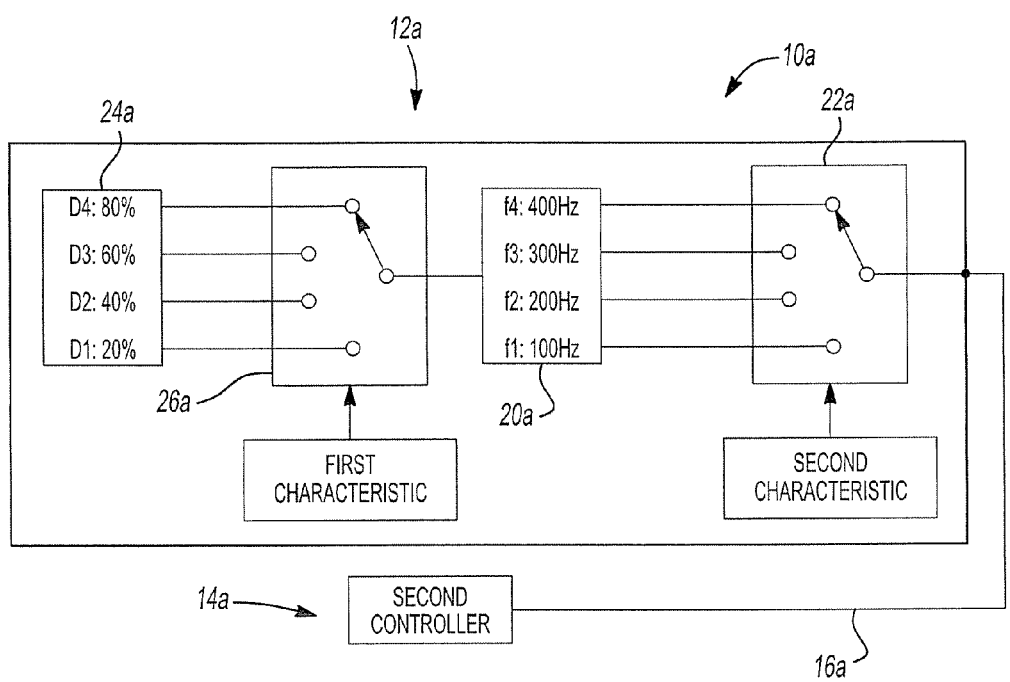
FIG. 3 is a schematic illustration of another diagnostic information system constructed in accordance with the teachings of the present disclosure.

Another diagnostic information system constructed in accordance with the teachings of the present disclosure is illustrated in FIG. 3 and generally indicated by reference numeral 10a. The DIS 10a can include a first controller 12a, a second controller 14a and a single wire 16a that can be employed to transmit diagnostic information from the first controller 12a to the second controller 14a.

The first controller 12a can include a duty cycle converter 24a, a duty cycle selector 26a, a frequency source 20a and a frequency selector 22a.

The duty cycle converter 24a can be configured to generate a plurality of first intermediate signals having different, predetermined duty cycles. Each of the duty cycles can be associated with a first diagnostic characteristic, such as a characteristic of a battery (not shown). In the particular example provided, the first diagnostic characteristic can include the temperature of the battery, the voltage of the battery, a rate at which current is being received into the battery, and a rate at which current is being discharged from the battery. By way of example, a duty cycle of 20% can be employed to designate the temperature of the battery, a duty cycle of 40% can be employed to designate the voltage of the battery, a duty cycle of 60% can be employed to designate the rate at which current is being received into the battery, and a duty cycle of 80% can be employed to designate the rate at which current is being discharged from the battery. The duty cycle converter 24a generate a plurality of first intermediate signals in which each of the first intermediate signals has a duty cycle that could be associated with the first diagnostic characteristic.

The duty cycle selector 26a can receive the first intermediate signals and can select one of the first intermediate signals based on the first diagnostic characteristic. In the example provided, the duty cycle selector 26a is a MUX that can be employed to select a category of information about the battery (i.e., battery temperature, battery voltage, rate of incoming current, rate of outgoing current). By way of example, the selected category of information about the battery is the voltage of the battery and the duty cycle selector 26 has selected the first intermediate signal that is associated with a duty cycle of 40%. The selected one of the first intermediate signals can be output to the frequency source 20a.

The frequency source 20a can be configured to receive the selected one of the first intermediate signals and to generate a plurality of second intermediate signals, each having different, predetermined frequencies and the duty cycle of the first intermediate signal. Each of the frequencies can be associated with a second diagnostic characteristic. In the particular example provided, the frequencies can be associated with various conditions that relate to the first diagnostic characteristic as shown in the following table.

| | First Diagnostic Characteristic | | | |
| --- | --- | --- | --- | --- |
| Frequency | Battery Temperature | Battery Voltage | Rate of Incoming Current | Rate of Outgoing Current |
| 100 Hz | Low | Low | 0 (Zero) | 0 (Zero) |
| 200 Hz | Normal | Normal | Low | Low |
| 300 Hz | High | High | Normal | Normal |
| 400 Hz | Fault | Fault | High | High |

Accordingly, as the first diagnostic characteristic in the example provided relates to the battery voltage, the frequencies can be employed to designate a low, normal, high or fault condition. The second intermediate signals can be output to the frequency selector 22.

The frequency selector 22 can receive the second intermediate signals and can select and output a selected one of the second intermediate signals based on the second diagnostic characteristic. In the example provided, the frequency selector 22 is a MUX (multiplexer) that is responsive to the condition of the battery temperature, the battery voltage, the rate of incoming current and the rate of outgoing current. By way of example, the first diagnostic characteristic is the battery voltage and as the battery voltage is identified as being "high", the frequency selector 22 has selected the first intermediate signal that is associated with a frequency of 300 Hz. The selected one of the second intermediate signals can be output from the duty cycle selector 26a. This resulting output signal is indicative of the first and second diagnostic characteristics. In this regard, the resulting output signal has a duty cycle that is associated with the first diagnostic characteristic (i.e., 40% in the example provided to correspond to the temperature of the battery), as well as a frequency that is associated with the second diagnostic characteristic (i.e., a frequency of 300 Hz in the example provided to correspond to a high battery voltage).

While the diagnostic information systems 10 and 10a have been illustrated and described as employing a discrete frequency source, a discrete frequency selector, a discrete duty cycle converter and a discrete duty cycle selector, those of skill in the art will appreciate that one or more of these components could be combined.

It will be appreciated that the above description is merely exemplary in nature and is not intended to limit the present disclosure, its application or uses. While specific examples have been described in the specification and illustrated in the drawings, it will be understood by those of ordinary skill in the art that various changes may be made and equivalents may be substituted for elements thereof without departing from the scope of the present disclosure as defined in the claims. Furthermore, the mixing and matching of features, elements and/or functions between various examples is expressly contemplated herein so that one of ordinary skill in the art would appreciate from this disclosure that features, elements and/or functions of one example may be incorporated into another example as appropriate, unless described otherwise, above. Moreover, many modifications may be made to adapt a particular situation or material to the teachings of the present disclosure without departing from the essential scope thereof. Therefore, it is intended that the present disclosure not be limited to the particular examples illustrated by the drawings and described in the specification as the best mode presently contemplated for carrying out the teachings of the present disclosure, but that the scope of the present disclosure will include any embodiments falling within the foregoing description and the appended claims.

What is claimed is:

1. A system for reporting module diagnostic information, the system comprising:
    a frequency source for providing at least two frequency signals, each of the at least two frequency signals being associated with a different frequency;
    a frequency selector for selecting one of the at least two frequency signals according to a first diagnostic characteristic;
    a duty cycle converter for generating at least two intermediate signals, each of the at least two intermediate signals having a frequency of the selected one of the at least two frequency signals, each of the at least two intermediate signals having a different duty cycle; and
    a duty cycle selector for selecting one of the at least two intermediate signals based on a second diagnostic characteristic, the duty cycle selector outputting a resulting output signal indicative of the first and second diagnostic characteristics.

2. The system of claim 1, wherein the frequency selector is a first MUX.

3. The system of claim 2, wherein the duty cycle selector is a second MUX.

4. The system of claim 1, wherein the duty cycle selector is a MUX.

5. The system of claim 1, further comprising a module that receives the resulting output signal.

6. The system of claim 5, wherein the resulting output signal is transmitted the module over a single wire.

7. A system for reporting module diagnostic information, the system comprising:
    a duty cycle generator for generating at least two intermediate signals, each of the intermediate signals having a different duty cycle;
    a duty cycle selector for selecting one of the at least two intermediate signals according to a first diagnostic characteristic;
    a frequency source receiving the selected one of the at least two intermediate signals, the frequency source generating a plurality of frequency signals, each of the frequency signals having a different frequency and a duty cycle associated with a duty cycle of the selected one of the at least two intermediate signals; and
    a frequency selector for selecting one of the plurality of frequency signals according to a second diagnostic characteristic and outputting a resulting output signal indicative of the first and second diagnostic characteristics.

8. The system of claim 7, wherein the frequency selector is a first MUX.

9. The system of claim 8, wherein the duty cycle selector is a second MUX.

10. The system of claim 7, wherein the duty cycle selector is a MUX.

11. The system of claim 7, further comprising a module that receives the resulting output signal.

12. The system of claim 11, wherein the resulting output signal is transmitted the module over a single wire.

13. A method for transmitting diagnostic information, the method comprising:
    selecting a frequency from a plurality of predetermined frequencies based on a first diagnostic condition;
    selecting a duty cycle from a plurality of predetermined duty cycles based on a second diagnostic condition; and
    generating a diagnostic signal that is transmitted over a single wire, the diagnostic signal being based on the selected frequency and the selected duty cycle and being processed by a controller.

14. The method of claim 13, wherein generating the diagnostic signal includes:
    transmitting a first intermediate signal to a duty cycle converter, the first intermediate signal having a frequency corresponding to the selected frequency;
    generating a plurality of second intermediate signals, each of the second intermediate signals having a different duty cycle, and wherein one of the second intermediate signals has a duty cycle corresponding to the selected duty cycle; and
    selecting the one of the second intermediate signals with the duty cycle that corresponds to the selected duty cycle.

15. The method of claim 14, wherein prior to transmitting the first intermediate signal, the method further comprises:
    generating a plurality of third intermediate signals, each of the third intermediate signals having a different frequency and wherein one of the third intermediate signals has a frequency corresponding to the selected frequency; and
    selecting the one of the third intermediate signals with the frequency that corresponds to the selected frequency.

16. The method of claim 15, wherein selecting the one of the third intermediate signals includes operating a first MUX based on the first diagnostic condition.

17. The method of claim 16, wherein selecting the one of the second intermediate signals includes operating a second MUX based on the second diagnostic condition.

18. The method of claim 13, wherein generating the diagnostic signal includes:
    transmitting a first intermediate signal to a frequency converter, the first intermediate signal having a duty cycle corresponding to the selected duty cycle;
    generating a plurality of second intermediate signals, each of the second intermediate signals having a different frequency, and wherein one of the second intermediate signals has a frequency corresponding to the selected frequency; and
    selecting the one of the second intermediate signals with the frequency that corresponds to the selected frequency.

19. The method of claim 18, wherein prior to transmitting the first intermediate signal, the method further comprises:
    generating a plurality of third intermediate signals, each of the third intermediate signals having a different duty cycle and wherein one of the third intermediate signals has a duty cycle corresponding to the selected duty cycle; and
    selecting the one of the third intermediate signals with the duty cycle that corresponds to the selected duty cycle.

20. The method of claim 19, wherein selecting the one of the third intermediate signals includes operating a first MUX based on the first diagnostic condition.

21. The method of claim 20, wherein selecting the one of the second intermediate signals includes operating a second MUX based on the second diagnostic condition.

* * * * *